United States Patent
Liang et al.

(10) Patent No.: US 8,235,650 B2
(45) Date of Patent: Aug. 7, 2012

(54) COOLING FAN WITH BALANCE STRUCTURE

(75) Inventors: Bao-Hua Liang, Shenzhen (CN); Yong-Kang Zhang, Shenzhen (CN); Jian-Feng Yan, Shenzhen (CN); Ying-Min Huang, Taipei Hsien (TW)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 1248 days.

(21) Appl. No.: 11/946,452

(22) Filed: Nov. 28, 2007

(65) Prior Publication Data
US 2009/0041582 A1    Feb. 12, 2009

(30) Foreign Application Priority Data
Aug. 10, 2007    (CN) .......................... 2007 1 0075765

(51) Int. Cl.
 F04D 29/04    (2006.01)
 F04D 29/46    (2006.01)
 F16C 39/06    (2006.01)
 H02K 7/09    (2006.01)

(52) U.S. Cl. ........ 415/107; 415/220; 415/229; 416/174; 384/446; 384/903

(58) Field of Classification Search .................. 415/220, 415/229, 107; 416/174, 244 R; 310/90.5, 310/90, 51; 417/423.12–423.14, 353, 354; 384/446, 903
See application file for complete search history.

(56) References Cited

U.S. PATENT DOCUMENTS

| | | | |
|---|---|---|---|
| 5,659,445 A * | 8/1997 | Yoshida et al. | 360/98.07 |
| RE35,718 E * | 1/1998 | Nii et al. | 384/133 |
| 6,567,268 B1 * | 5/2003 | Hsieh | 361/695 |
| 6,921,996 B2 | 7/2005 | Parsoneault et al. | |
| 7,145,275 B2 * | 12/2006 | Yang et al. | 310/90.5 |
| 2007/0024137 A1 | 2/2007 | Otsuki et al. | |
| 2008/0238228 A1 * | 10/2008 | Chang et al. | 310/90 |

FOREIGN PATENT DOCUMENTS

| | | | |
|---|---|---|---|
| JP | 2001050250 A * | 2/2001 | |
| JP | 2002034205 A * | 1/2002 | |

* cited by examiner

*Primary Examiner* — Edward Look
*Assistant Examiner* — Jesse Prager
(74) *Attorney, Agent, or Firm* — Altis Law Group, Inc.

(57) ABSTRACT

A cooling fan includes a fan housing (30) having a central tube (34) extending upwardly therefrom, a bearing (60) being received in the central tube, a stator (20) being mounted around the central tube, and a rotor (10) having a shaft (18) extending through the bearing. At least one notch (180, 184) is defined in an end of the shaft. A balance structure (62) is mounted around the shaft, and has a portion facing and surrounding an upper portion of the at least one notch of the shaft. The balance structure is made of magnetic material, which can attract the shaft downward to thereby counter the upward force generated by the rotor when it is driven to rotate. Accordingly, the noise problem incurred by the floating of the rotating rotor can be resolved by the present invention.

8 Claims, 6 Drawing Sheets

COOLING FAN WITH BALANCE STRUCTURE

CROSS-REFERENCE TO RELATED APPLICATION

This application is related to a co-pending application entitled a same title with the present application, assigned to the same assignee of this application and filed on Jul. 16, 2007 with Ser. No. 11/778,545. The disclosure of the co-pending application is wholly incorporated herein by reference.

BACKGROUND OF THE INVENTION

1. Field of the Invention

The present invention relates to a cooling fan, and more particularly relates to a cooling fan with a balance structure for maintaining stable rotation of a rotor thereof.

2. Description of Related Art

With the continuing development of the electronic technology, electronic packages such as CPUs (central processing units) are generating more and more heat that requires immediate dissipation. Cooling fans are commonly used in combination with heat sinks for cooling the CPUs.

A conventional cooling fan includes a stator and a rotor having a hub with a plurality of fan blades extending therefrom. The stator establishes an alternating magnetic field interacting with the magnetic field of the rotor to drive the rotor to rotate. Thus rotation of the fan blades generates a forced airflow for cooling the electronic packages, such as the CPUs. The stator includes a bearing defining a bearing hole therein. The rotor has a shaft extending into the bearing hole and is thus rotatably supported by the bearing. However, during rotation of the rotor, the rotating fan blades generate an external pressure which pulls the rotor to move upwardly along the axial direction away from the stator, whereby the rotor is in a somewhat "floating" condition. The floating rotor is inclined to generate a level of noise, which sometimes is unacceptable.

For the foregoing reasons, therefore, there is a need in the art for a cooling fan which overcomes the above-mentioned problems.

SUMMARY OF THE INVENTION

According to a preferred embodiment of the present invention, a cooling fan includes a fan housing having a central tube extending upwardly therefrom, a bearing received in the central tube, a stator mounted around the central tube, and a rotor having a shaft extending through the bearing. At least one notch is defined in an end of the shaft. A balance structure is mounted around the shaft, and has a portion surrounding and facing an upper portion of the at least one notch of the shaft. The balance structure is made of magnetic material, which can attract the shaft downward to thereby counter the upward force generated by the rotor when it is driven to rotate. Accordingly, the noise problem incurred by the floating of the rotating rotor can be resolved by the present invention.

Other advantages and novel features of the present invention will be drawn from the following detailed description of the preferred embodiments of the present invention with attached drawings, in which:

BRIEF DESCRIPTION OF THE DRAWINGS

Many aspects of the present cooling fan can be better understood with reference to the following drawings. The components in the drawings are not necessarily drawn to scale, the emphasis instead being placed upon clearly illustrating the principles of the present cooling fan. Moreover, in the drawings, like reference numerals designate corresponding parts throughout the several views.

DETAILED DESCRIPTION OF THE INVENTION

Figure 1:
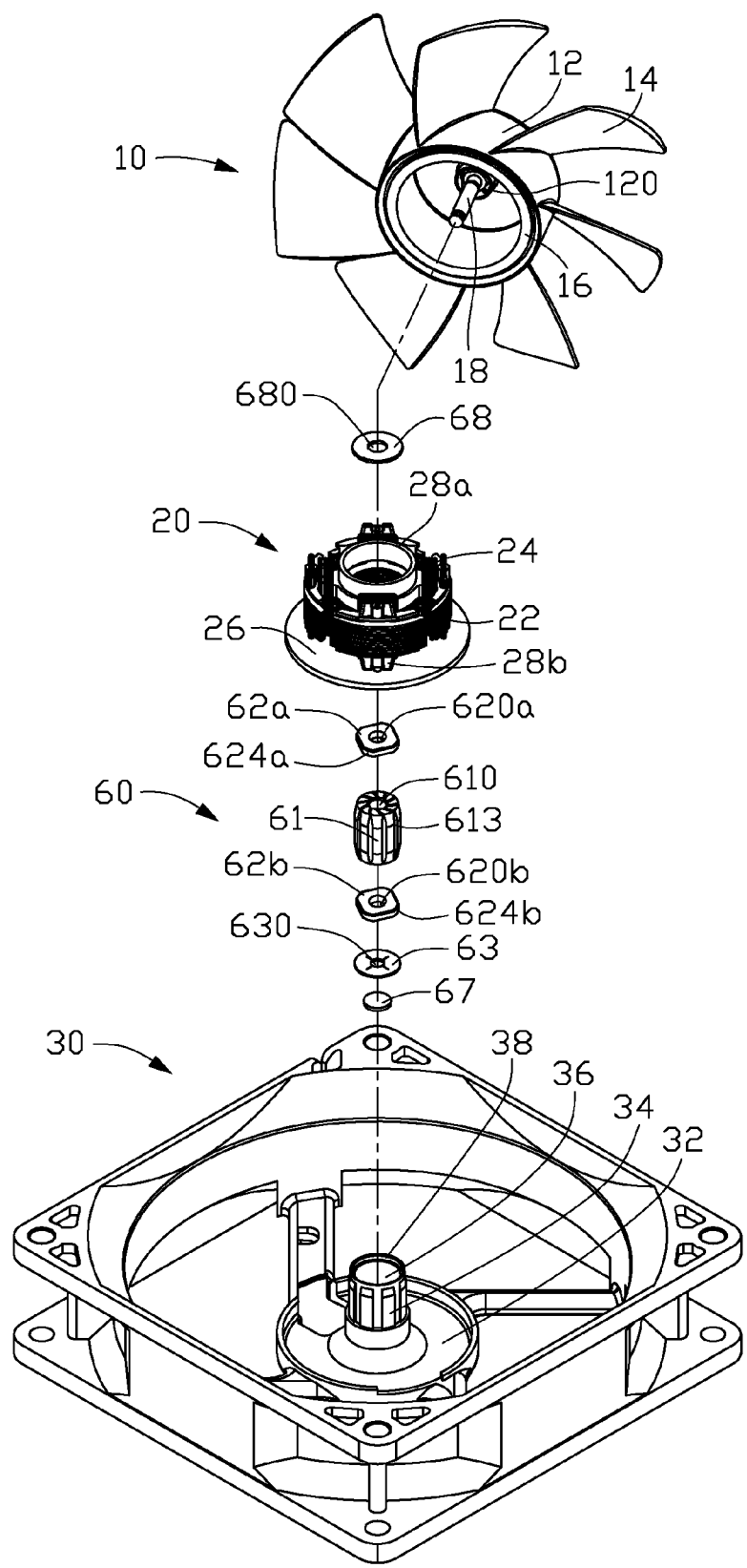
FIG. 1 is an isometric, exploded view of a cooling fan in accordance with a preferred embodiment of the present invention.
Figure 2:
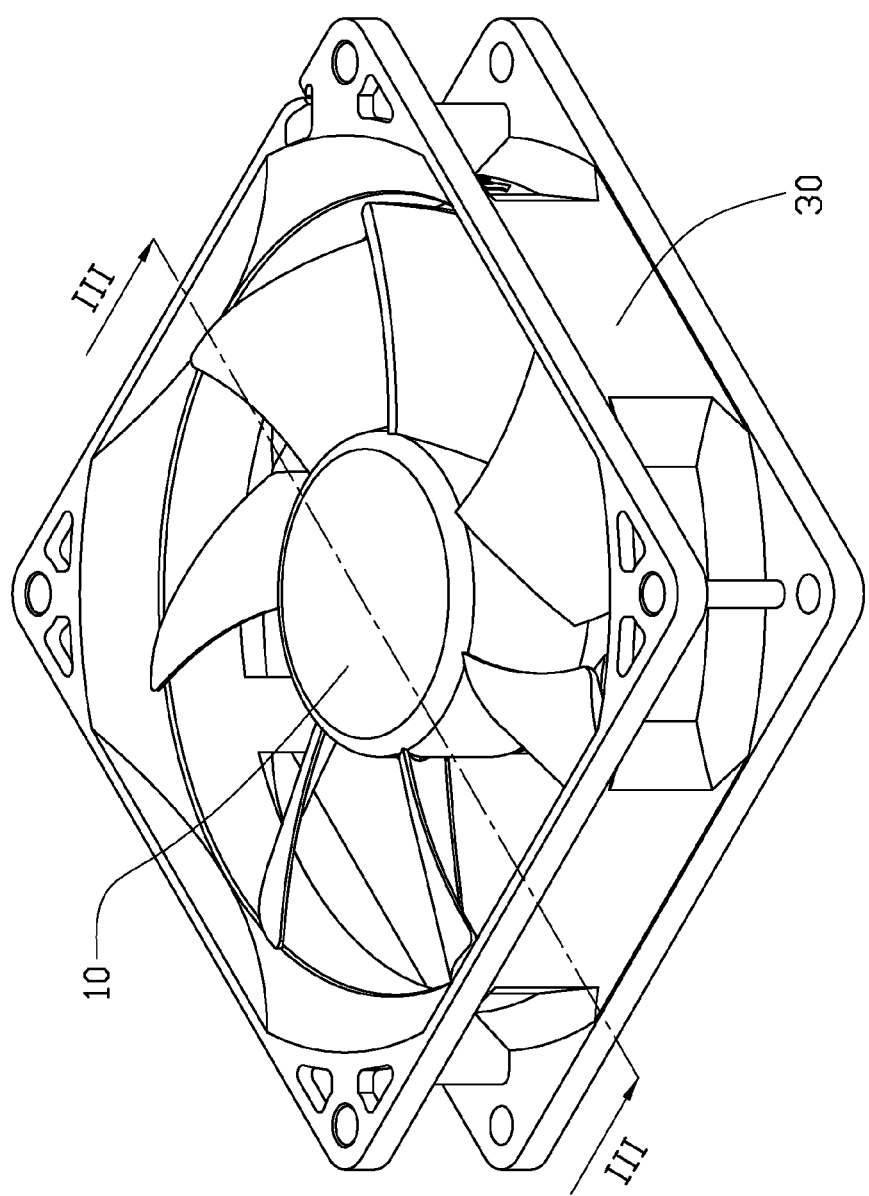
FIG. 2 is an isometric, assembled view of the cooling fan of FIG. 1.
Figure 3:
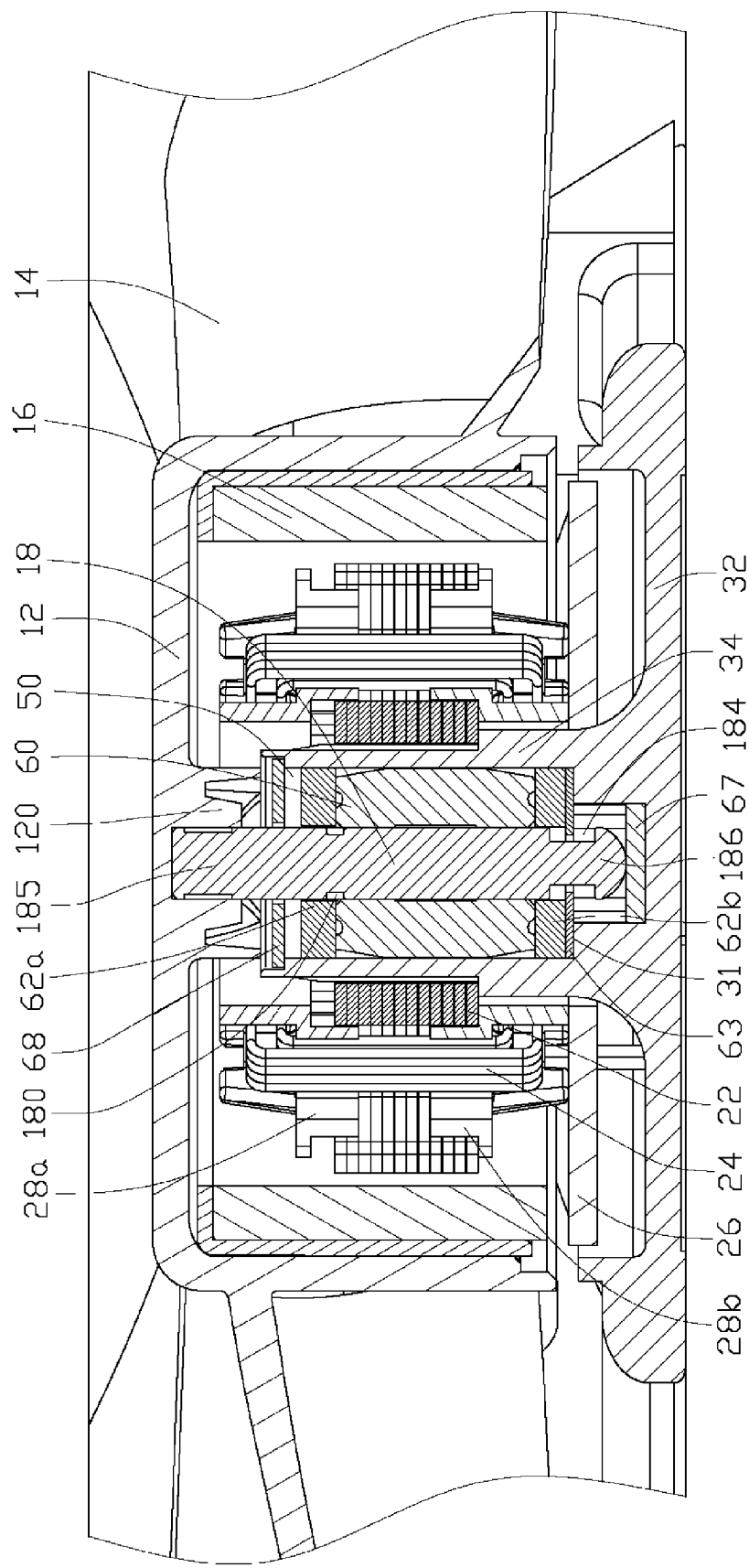
FIG. 3 is a cross-sectional view of the cooling fan taken along line III-III of FIG. 2.

Referring to FIGS. 1 through 3, a cooling fan according to a preferred embodiment of the present invention includes a fan housing 30, a pair of balance structures 62a, 62b, a bearing 60, a rotor 10, and a stator 20 in respective to which the rotor 10 is rotatable.

The fan housing 30 includes a base 32 and a central tube 34 extending upwardly from a central portion of the base 32. The central tube 34 defines a central hole 36 therein and forms an open end at a top portion thereof. An annular recess 38 is formed on an inner circumference of the top portion of the central tube 34. The recess 38 communicates with the central hole 36. Thus the top portion of the central tube 34 has an inner diameter larger than that of the other portion of the central tube 34. A bottom end of the central tube 34 is closed. An annular protrusion 31 extends inwardly from the inner circumference of the bottom end of the central tube 34, and thus forms a step in the central hole 36 at the bottom end of the central tube 34.

The rotor 10 includes a hub 12 forming a shaft seat 120 in a central portion thereof, a plurality of fan blades 14 extending radially from an outer periphery of the hub 12, a permanent magnet 16 adhered to an inner side of the hub 12, and a shaft 18 being fixedly received in the shaft seat 120 and extending downwardly from a central portion of the shaft seat 120. An annular lower notch 184 is defined near a free end 186 of the shaft 18 far from the hub 12, and an annular upper notch 180 is defined near a fixing end 185 of the shaft 18 secured to the shaft seat 120 of the hub 12. The fixing and free ends 185, 186 are respectively located at top and bottom of the shaft 18.

The stator 20 includes a stator core consisting of layered yokes 22. Each yoke 22 includes an annular main body and four claws extending radially and outwardly from the main body. Stator coils 24 wind on the claws of the stator core to establish an alternating magnetic field. A PCB 26 (Printed Circuit Board) with electronic components mounted thereon is electrically connected with the stator coils 24 to control electrical current flowing through the coils 24. To avoid the coils 24 from coming into electrical contact with the stator core, upper and lower insulating frames 28a, 28b are used to cover the stator core and electrically insulate the stator coils 24 from the stator core.

The bearing 60 is received in the central hole 36 of the central tube 34. The bearing 60 defines a bearing hole 610 therein for extension of the shaft 18 therethrough. A middle portion of the bearing hole 610 of the bearing 60 has a diameter larger than that of the top and bottom ends of the bearing hole 610 and an outer diameter of the shaft 18. When the fan is assembled, a narrow clearance is defined between each end of the bearing 60 and the shaft 18 for reducing oil loss of the cooling fan, and a space (not labeled) is defined between the middle portion of the bearing 60 and the shaft 18 for reserving the lubrication oil in the bearing 60. By the provision of the middle portion of the bearing hole 610 which has a larger diameter, the contacting area between the bearing 60 and the shaft 18 is reduced, thereby reducing the friction generated between the bearing 60 and the shaft 18. A plurality of channels 613 communicating with the bearing hole 610 are defined in an outer surface 61 of the bearing 60 for allowing the lubricant oil to flow back into the bearing 60.

Figure 4:
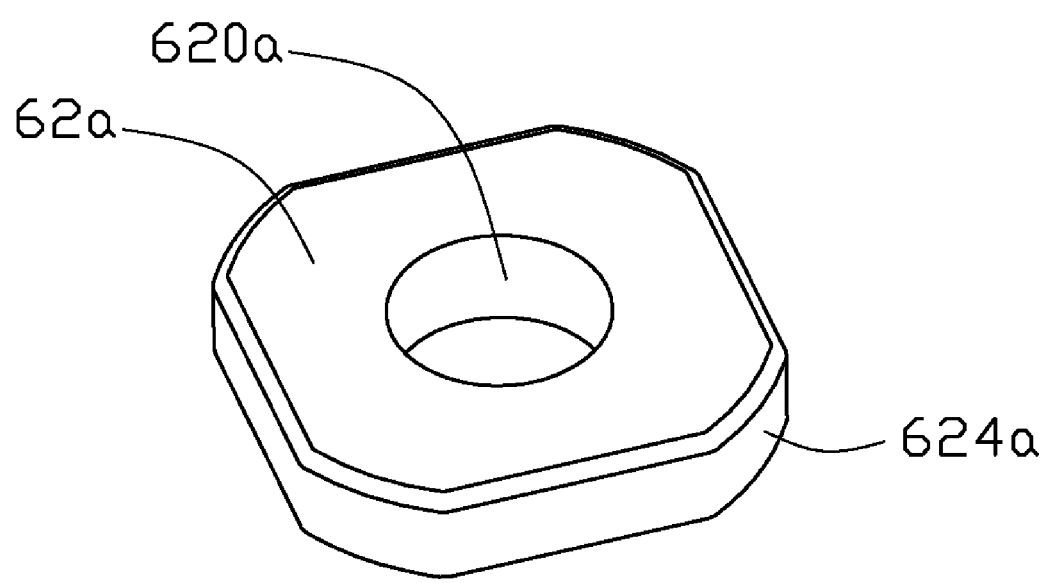
FIG. 4 is an enlarged, isometric view of a balance structure of the cooling fan of FIG. 1.
Figure 5:
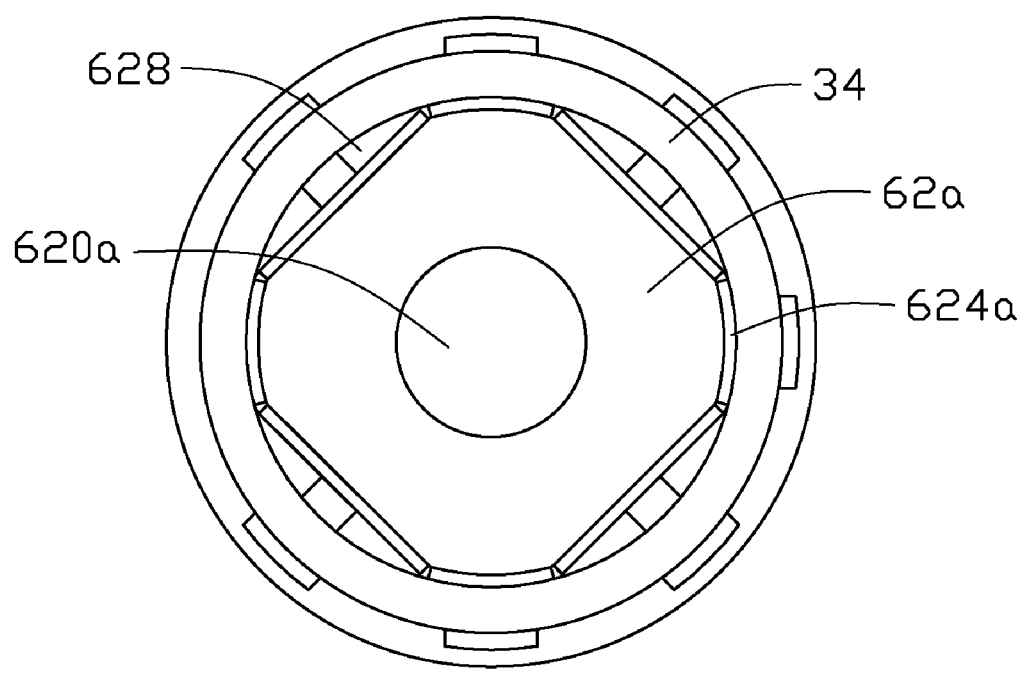
FIG. 5 is a top view of the balance structure mounted in a central tube of the cooling fan of FIG. 1.

Referring to FIGS. 4-5, the balance structures 62a, 62b are permanent magnets. The balance structures 62a, 62b are identical to each other and each have a shape of being approximately square pellet. A through hole 620a, 620b with a diameter approximately the same as the outer diameter of the shaft 18 is defined in a central portion of each balance structure 62a, 62b. Each of four corners of the balance structures 62a, 62b forms a chamfer angle 624a, 624b. The chamfer angle 624a, 624b has a radius of curvature approximately the same as a radius of the central hole 36 of the central tube 34. When the balance structure 62a, 62b is mounted into the central hole 36, the four chamfer angles 624a, 624b conformably abut an inner surface of the central tube 34, thus fixing the balance structure 62a, 62b into the central tube 34. The four sides of the balance structure 62a, 62b are spaced from the inner surface of the central tube 34 and thus define a gap 628 between each side of the balance structure 62a, 62b and the inner surface of the central tube 34.

When assembled, the stator 20 is mounted around the central tube 34. The bearing 60 is received in the central hole 36 of the central tube 34 and is arranged over the protrusion 31. The top end of the bearing 60 is lower than the top of the central tube 34. An oil-retaining ring 68 is received in the recess 38 of the central tube 34 and mounted around the shaft 18 for sealing the bearing 60 in the central tube 34. The oil-retaining ring 68 defines a circular hole 680 for extension of the shaft 18 therethrough. An oil buffer 50 is thus defined between the central tube 34, the shaft 18, the oil-retaining ring 68 and the bearing 60. The oil buffer 50 communicates with the channels 613 and the bearing hole 610 of the bearing 60. The free end 186 of the shaft 18 extends through the bearing hole 610 of the bearing 60 into the central tube 34. The lower notch 184 of the shaft 18 is located under the bottom end of the bearing 60, and the upper notch 180 of the shaft 18 has a lower portion facing an inner surface of the top end of the bearing 60 and an upper portion above the top end of the bearing 60. A wear pad 67 made of highly abrasion resistant material is mounted in a bottom end of the central hole 36 of the central tube 34 to face and supportively engage the free end 186 of the rotary shaft 18. A locking washer 63 is arranged on the protrusion 31 of the central tube 34. The locking washer 63 defines an inner hole 630 with a diameter smaller than the diameter of the shaft 18, but larger than the diameter of the portion of the shaft 18 defining the notch 184. Thus the locking washer 63 is engaged in the notch 184 to limit movement of the shaft 18 along an axial direction thereof.

The balance structure 62a, 62b are mounted into the central hole 36 and arranged on the top and bottom ends of the bearing 60, respectively. The four chamfer angles 624a, 624b of each balance structure 62a, 62b abut the inner surface of the central tube 34, and the four sides of the balance structure 62a, 62b are spaced from the inner surface of the central tube 34. The gaps 628 between the sides of the balance structure 62a, 62b and the inner surface of the central tube 34 communicate with the channels 613 of the bearing 60. The upper balance structure 62a is arranged between the top end of the bearing 60 and the oil-retaining ring 68. A top side of the upper balance structure 62a is located above the upper notch 180 of the shaft 18. A lower portion of the upper balance structure 62a faces the upper portion of the upper notch 180. Thus, the upper balance structure 62a has a lower portion facing an upper portion of the upper notch 180 of the shaft 18, and has an upper portion facing a portion of the shaft 18 above the upper notch 18. The lower balance structure 62b is arranged between the bottom end of the bearing 60 and the locking washer 63. A top of the lower balance structure 62b is located above the lower notch 184. A bottom of the lower balance structure 62b is located corresponding to a middle of the notch 184. In other words, the lower balance structure 62b has a lower portion facing an upper portion of the lower notch 184 of the shaft 18, and has an upper portion facing a portion of the shaft 18 immediately above the lower notch 184. As the upper portions of the balance structures 62a, 62b face the portions of the shaft 18 near and above the notches 180, 184, respectively, and the lower portions of the balance structures 62a, 62b face the upper portions of the notches 180, 184 of the shaft 18, respectively, the balance structure 62a, 62b can generate a magnetic attraction force on the shaft 18 along the axial direction, which pulls the shaft 18 downwardly.

During operation, the rotor 10 is driven to rotate by the interaction of the alternating magnetic field established by the stator 20 and the magnetic field of the rotor 10. The lubrication oil creeps up along the rotating shaft 18 under the influence of the centrifugal force generated by the rotation of the shaft 18 and then escapes to the oil buffer 50 through the clearance defined between the top end of the bearing 60 and the shaft 18. The oil-retaining ring 68 sufficiently prevents the oil from leaking out so that the escaped oil is received in the buffer 50 and then flows back to the bearing 60 through the channels 613 and the gaps 628. Good lubrication of the bearing 60 and shaft 18 is thus constantly maintained, thereby enabling the cooling fan to run smoothly, stably and with less vibration. Furthermore, as the lower portions of the balance structures 62a, 62b facing the notches 180, 184 and the upper portions of the balance structures 62a, 62b facing the shaft 18, the balance structures 62a, 62b can generate a magnetic attraction force acting on the shaft 18 along the axial direction. When rotation of the rotor 10 generates an external pressure which pulls the rotor 10 upwardly along the axial direction thereof, the balance structures 62a, 62b can magnetically attract the shaft 18 and pull the shaft 18 downwardly along the axial direction. Thus the axially upward movement and possible floating of the rotor 10 during rotation of the cooling fan is avoided, and thus the problem of the noise generated by the floating of the rotor 10 and the possible collision between the free end 186 of the shaft 18 and the wear pad 67 during an unstable period of the floating of the rotor 10 can be solved by the present invention.

Figure 6:
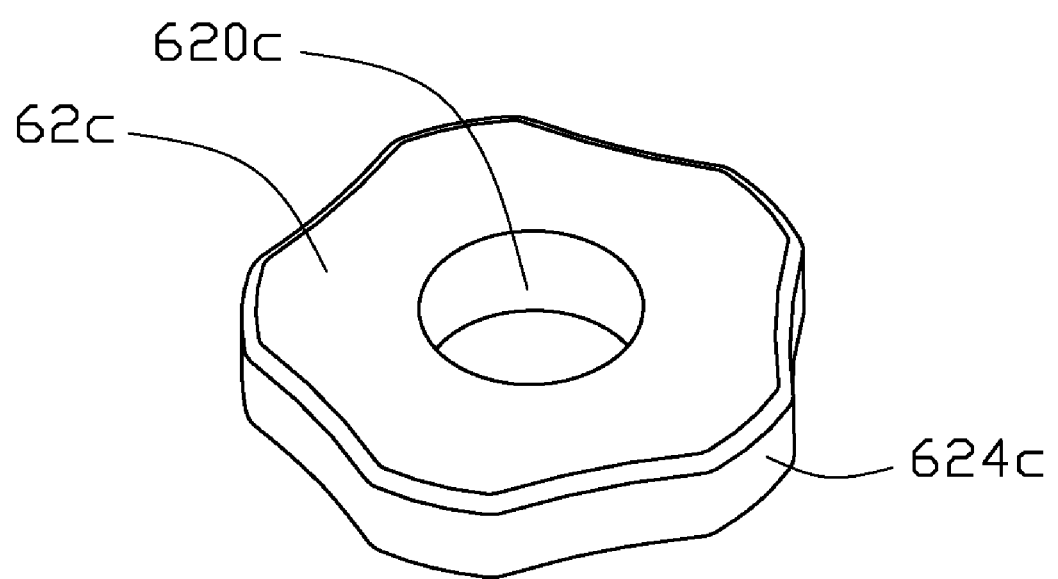
FIG. 6 shows an isometric view of the balance structure in accordance with an alternative embodiment of the present invention.

FIG. 6 shows an alternative embodiment of the balance structure 62c. Similar to the first embodiment, the balance structure 62c is pellet-shaped and defines a central hole 620c. The difference of the second embodiment over the first embodiment is that the balance structure 62c has a pentagonal-shaped cross section. Also each of the five corners of the balance structure 62c forms a chamfer angle 624c. When the balance structure 62c is mounted into the central hole 36 of the central tube 34, the five chamfer angles 624c abut the inner surface of the central tube 34, and the five sides of the balance structure 62c are spaced from the inner surface of the central tube 34. It can be understood that the balance structure 62a, 62b, 62c is not limited to having four sides or five sides as previously discussed, it can also have six or more sides. Alternatively, the balance structure 62a, 62b, 62c is not limited to being polygonal, pellet-shaped, it can also be cylindrical-shaped.

It is understood that the invention may be embodied in other forms without departing from the spirit thereof. Thus, the present example and embodiment are to be considered in all respects as illustrative and not restrictive, and the invention is not to be limited to the details given herein.

What is claimed is:

1. A cooling fan comprising:
   a fan housing having a central tube extending upwardly therefrom;
   a bearing received in the central tube, and defining a bearing hole therein;
   a stator mounted around the central tube;
   a rotor having a shaft extending through the bearing hole of the bearing, at least one notch being defined in an end of the shaft; and
   at least one balance structure being mounted around the shaft with a top higher than the at least one notch of the shaft and a lower portion facing and surrounding an upper portion of the notch, the at least one balance structure exerting a downwardly attractive, magnetic force on the shaft,
   wherein the shaft defines two notches at two opposite ends thereof, and the at least one balance structure comprises upper and lower balance structures respectively arranged on two opposite ends of the bearing and mounted around the shaft with lower portions of the upper and lower balance structures facing upper portions of the notches of the shaft, respectively.

2. The cooling fan as claimed in claim 1, wherein the central tube has an annular protrusion extending inwardly from a bottom end thereof, the bearing being arranged on the protrusion of the central tube, and the lower balance structure being arranged between the protrusion and the bearing.

3. The cooling fan as claimed in claim 2, wherein a locking washer is engaged in a lower one of the two notches of the shaft to limit movement of the shaft along an axial direction thereof, the locking washer being arranged between the protrusion of the central tube and the lower balance structure.

4. The cooling fan as claimed in claim 1, wherein an oil-retaining ring is mounted on a top of the central tube and thus an oil buffer is defined among the bearing, the central tube, the shaft and the oil-retaining ring.

5. The cooling fan as claimed in claim 4, wherein the upper balance structure is arranged between the bearing and the oil-retaining ring.

6. A cooling fan, comprising:
   a fan housing having a central tube extending upwardly therefrom, the central tube having an annular protrusion extending inwardly from a bottom end thereof;
   a bearing received in the central tube and mounted on the protrusion of the central tube;
   a stator mounted around the central tube;
   a rotor comprising a hub and a shaft having a fixing end being received in the hub and a free end extending through the bearing, upper and lower notches being defined in the shaft near the fixing end and the free end, respectively;
   a pair of balance structures being arranged on two opposite ends of the bearing, respectively, each balance structure having a lower portion facing an upper portion of a corresponding notch of the shaft, the balance structures exerting a downwardly attractive, magnetic force on the shaft.

7. The cooling fan as claimed in claim 6, wherein the balance structures each are pellet-shaped with a cross section being polygonal-shaped, each corner of the balance structures forming a chamfer angle with a radius of curvature being approximately the same as an inner radius of the central tube and thus abutting an inner surface of the central tube, and each side of the balance structures being spaced from the inner surface of the central tube and thus defining a gap between each side of the balance structure and the inner surface of the central tube.

8. The cooling fan as claimed in claim 6, wherein each of the balance structures is a permanent magnet.

* * * * *